US004001605B2

United States Statutory Invention Registration [19]

[11] Reg. Number: H1605

Leupold

[45] Published: Nov. 5, 1996

[54] SUPERCURRENT BIFILAR TWISTER

[75] Inventor: Herbert A. Leupold, Eatontown, N.J.

[73] Assignee: The United States of America as represented by the Secretary of the Army, Washington, D.C.

[21] Appl. No.: 826,560

[22] Filed: Jan. 27, 1992

[51] Int. Cl.[6] ..... H01L 39/00

[52] U.S. Cl. ..... 335/216; 505/705; 505/725; 505/727

[58] Field of Search ..... 335/216; 324/248; 505/705; 336/DIG. 1

[56] References Cited

U.S. PATENT DOCUMENTS 4,283,687 8/1981 Madey ..... 331/94.5

FOREIGN PATENT DOCUMENTS 2151203 5/1973 Germany ..... 335/216
2162684 2/1986 United Kingdom ..... 315/5

*Primary Examiner*—Bernarr E. Gregory

*Attorney, Agent, or Firm*—Michael Zelenka; William H. Anderson

[57] ABSTRACT

A closed flexible superconductive ribbon, is made to confine magnetic flux and which is thereafter elongated and selectively twisted to form a desired type of magnetic field. The shape of the twist is varied for the particular application. A helical field source for twister type geometries, for example, can be implemented by winding the stretched superconducting loop around a cylindrical tube. In another embodiment, the superconductive ribbon is twisted into two halves, one of which is rotated 180° with respect to the other. In such a configuration, two fields exist which are mutually opposite to each other.

1 Claim, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SUPERCURRENT BIFILAR TWISTER

GOVERNMENT INTEREST

The invention described herein may be manufactured, used, and licensed by or for the Government for governmental purposes without the payment to me of any royalties thereon.

CROSS REFERENCE TO RELATED APPLICATION

This invention is related to an application entitled, "Critical Field And Continuity Testing Device For Superconducting Materials", (CECOM 4360), filed in the name of Herbert A. Leupold, the present inventor, on Mar. 22, 1991, and which is identified in the United States Patent and Trademark Office as Ser. No. 07/673,422 now U.S. Pat. No. 5,113,135. This application, moreover, is assigned to the assignee of this invention and is meant to be incorporated herein specifically by reference.

BACKGROUND OF THE INVENTION

Field of the Invention

The present invention relates generally to superconductors, and more particularly to a magnetic field source formed from a flexible closed superconducting ribbon.

Description of the Prior Art

Superconductivity was first observed in 1911 by a Dutch scientist by the name of Heike Kamerlingh-Onnes who observed the disappearance of all electrical resistance from a thin capillary of mercury metal located in a bath of liquid helium. More recently, superconductivity has become an active area of technology with the discovery of high temperature superconductive materials in 1986 when K. Alex Mueller and J. George Bednorz synthesized a complicated compound and found superconductivity to occur therein in the region of 35° Kelvin. This was followed shortly thereafter in 1987 when Maw-Kuen Wu and Paul Chu observed a transition to the superconducting state using only liquid nitrogen as a coolant.

Two effects are characteristic of the superconductivity phenomenon, i.e. it is associated with perfect conductivity and perfect diamagnetism. Perfect conductivity means that the material exhibits zero electrical resistance while perfect diamagnetism means that a device in a superconductive state excludes all magnetic fields from its interior. The latter effect results from internally generated currents that produce opposing magnetic fields. However, it is also well known that superconductors can only carry so much current or withstand so much external magnetic field before losing their unique characteristics of perfect conductivity and perfect diamagnetism. These properties of superconductors are called critical currents and critical magnetic fields. Thus when a superconductor carries a current which is equal to a value called the critical current $I_c$, its superconductivity abruptly vanishes. Alternatively, when a strong external field, termed the critical field $H_c$, is applied, superconductivity vanishes once again. However, both the critical current and critical field are functions of temperature and more particularly, a critical temperature $T_c$.

It is generally known that flux can be normally trapped and confined in superconducting rings in one of two ways. The first is when the ring is placed within a magnetic field H with its axis aligned with the field while the temperature is above the transition or critical temperature $T_c$ of the material from which the ring is fabricated, and after which the temperature is lowered below $T_c$ and the field H removed. This leaves the ring with trapped flux and a persistent current flowing in the ring. The second way is to place a ring that is below its transition temperature $T_c$ into an axial field H that is greater than the critical field $H_c$ and then to reduce the field H to zero. This is accompanied by the ring becoming superconductive as the field drops below $H_c$ leaving a flux $\theta=H_cA$ trapped in the ring where A is the interior cross sectional area of the ring.

In the above cross referenced related application U.S. Ser. No. 07/673,422, there is disclosed the concept of varying the inner cross sectional area formed by a superconductive loop including a section of relatively low critical field material. Reduction of the internal area increases the magnetic field at the surface of the loop. When the field at this section reaches $H_c$, it becomes normal and magnetic flux leaks from within the loop through the low critical field section. This enables one to detect and measure the $H_c$ of a test piece which forms the section of low critical field.

SUMMARY

It is therefore an object of the present invention to provide an improvement in superconductor devices.

It is another object of the invention to store and confine magnetic flux in a superconductor for providing a magnetic field source.

It is yet another object of the invention to superconductively generate a helical magnetic field source.

And still another object of the invention is to generate a helical magnetic field source for electronic devices without electrical currents or bulky, inflexible permanent magnets.

These and other objects are achieved by a method whereby a flux storage device, such as a closed flexible superconductive ribbon, is made to confine magnetic flux and which is thereafter elongated and selectively twisted to form a desired type of magnetic field. The shape of the twist is thus variable for the particular application. A helical field source for twister type geometries, for example, can be implemented by winding the stretched superconducting loop around a cylindrical tube. In another embodiment, the superconductive ribbon is twisted into two halves, one of which is rotated 180° with respect to the other. In such a configuration, two fields exist which are mutually opposite to each other.

BRIEF DESCRIPTION OF THE DRAWINGS

The following detailed description of the invention will be more readily understood when considered in conjunction with the accompanying drawings wherein.

DETAILED DESCRIPTION OF THE INVENTION

Figure 1:
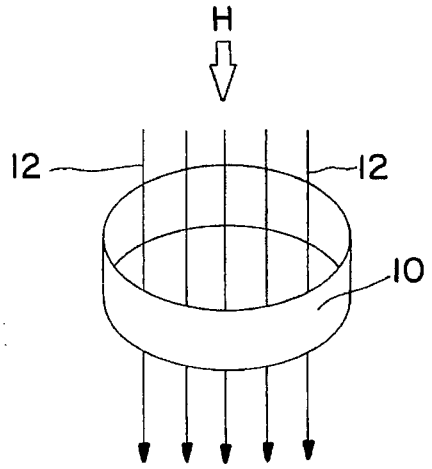
FIG. 1 is a schematic diagram illustrative of the starting point of the method in accordance with the subject invention.
Figure 2:
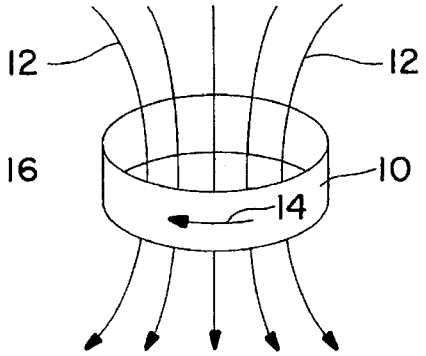
FIG. 2 is a schematic diagram illustrative of a first intermediate step of the method in accordance with the subject invention.

Referring now to the figures and more particularly to FIG. 1, shown thereat is a superconductor device 10 in the form of a closed flexible superconductive ribbon which is axially oriented with a relatively strong magnetic field H while it is above its transition temperature $T_c$. Reference numeral 12 denotes the flux lines of the externally applied magnetic field H. Thereafter, as shown in FIG. 2, the ribbon 10 is cooled below its transition temperature $T_c$ and the field H is removed. The ribbon 10 which now exhibits superconducting properties has a persistent current flowing therein as shown by the arrow designated by reference numeral 14. The result is that magnetic flux 12 is trapped within the interior space 16 of the superconducting ribbon 10.

Figure 3:
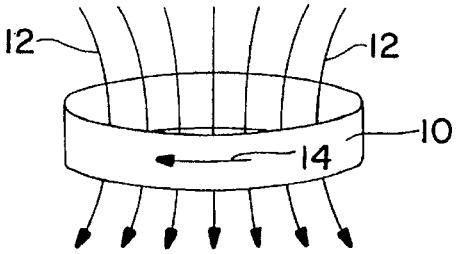
FIG. 3 is a schematic diagram illustrative of a second intermediate step of the method in accordance with the subject invention.

Next as shown by way of FIG. 3, if the ribbon 10 is stretched so that the cross sectional area of the inner space 16 enclosed by the ribbon is reduced, the magnetic field within the ribbon 10 is enhanced or augmented, since the enclosed flux must remain constant and since the magnetic field H is directly proportional to flux and inversely proportional to area, i.e. $H=\theta/A$.

Figure 4:
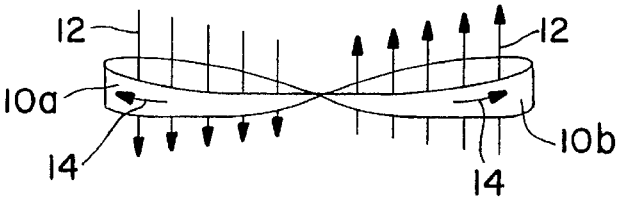
FIG. 4 is a schematic diagram illustrative of one of the final steps which can be utilized in the method of the subject invention.

If the superconducting loop 10 is next twisted, for example, into two parts as shown in FIG. 4 where it is twisted in half so that the ribbon 10 forms two superconducting halves $\mathbf{10}_a$ and $\mathbf{10}_b$, une of which is rotated 180° with respect to the other, the persistent current 14 will now flow counterclockwise in the ribbon portion $\mathbf{10}_a$ and clockwise in the ribbon portion $\mathbf{10}_b$. This results in the flux 12 being split between the two ribbon halves $\mathbf{10}_a$ and $\mathbf{10}_b$, which flow in mutually opposite directions.

If, on the other hand, the superconducting ribbon 10 is twisted in a helix about a cylindrical tube, not shown, for example in a bifilar fashion, a relatively high twister, i.e. helical field results, which can be utilized, for example, as the transverse magnetic field for helical free electron lasers. There would also, of course, be an untwisting force and a loop expanding force due to the compaction of the flux and therefore provisions for holding the loop in the required shape must be made. When desirable, other twisted configurations may also be resorted to for use in connection with relatively complex geometries without the need for external electrical currents or bulky, inflexible permanent magnets.

Having thus shown and described what is at present considered to be the preferred method of the subject invention, it should be noted that the same has been made by way of illustration and not limitation. Accordingly, all alterations, modifications and changes coming within the spirit and scope of the invention are herein meant to be included.

What is claimed is:

1. A method of forming alternating magnetic fields of opposed polarities useful in free electron lasers comprising the steps of:

forming a ribbon of superconducting material into a bifilar configuration such that the ribbon is in a continuous figure 8 shape with two circular portions;

exposing one circular portion of the ribbon to a magnetic field while the ribbon is in a nonsuperconducting state; and cooling the ribbon to a temperature at which the ribbon becomes superconducting.

* * * * *